(12) United States Patent
Kwon

(10) Patent No.: US 9,397,297 B2
(45) Date of Patent: Jul. 19, 2016

(54) OPTICAL PATTERNING MASK AND METHOD OF FABRICATING DISPLAY DEVICE USING THE SAME

(71) Applicant: Samsung Display Co., Ltd., Yongin (KR)

(72) Inventor: Young Gil Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 6 days.

(21) Appl. No.: 14/621,937

(22) Filed: Feb. 13, 2015

(65) Prior Publication Data

US 2016/0043320 A1    Feb. 11, 2016

(30) Foreign Application Priority Data

Aug. 5, 2014   (KR) ..................... 10-2014-0100554

(51) Int. Cl.
*B41M 5/40* (2006.01)
*H01L 51/00* (2006.01)
*B41M 5/48* (2006.01)
*B41M 5/42* (2006.01)

(52) U.S. Cl.
CPC ............. *H01L 51/0013* (2013.01); *B41M 5/42* (2013.01); *B41M 5/426* (2013.01); *B41M 5/48* (2013.01)

(58) Field of Classification Search
CPC ... H01L 51/0013; H01L 27/3244; G03F 1/50; G03F 1/52; G03F 1/54; B41M 5/40; B41M 5/46; B41M 5/48; B41M 5/426; B41M 5/42
USPC ...................... 430/5, 199, 200, 201
See application file for complete search history.

(56) References Cited

U.S. PATENT DOCUMENTS

| | | | |
|---|---|---|---|
| 8,093,612 B2 | 1/2012 | Tanaka | |
| 8,153,201 B2 | 4/2012 | Aoyama et al. | |
| 8,277,871 B2 | 10/2012 | Aoyama et al. | |
| 2009/0169809 A1* | 7/2009 | Yokoyama | H01L 51/0013 428/138 |
| 2009/0197017 A1* | 8/2009 | Tanaka | H01L 51/0013 427/596 |
| 2009/0220706 A1* | 9/2009 | Yamazaki | C23C 14/28 427/596 |
| 2012/0099615 A1* | 4/2012 | Sun | H01L 51/0013 372/103 |
| 2015/0132875 A1* | 5/2015 | Lee | H01L 51/0012 438/29 |

FOREIGN PATENT DOCUMENTS

| | | |
|---|---|---|
| JP | 2010-093068 | 4/2010 |
| KR | 10-2009-0041314 | 4/2009 |
| KR | 10-2009-0041347 | 4/2009 |

* cited by examiner

*Primary Examiner* — John A McPherson
(74) *Attorney, Agent, or Firm* — H.C. Park & Associates, PLC

(57) ABSTRACT

An optical patterning mask, including a base substrate, a reflective layer disposed on the base substrate, the reflective layer including a first opening, a shadow pattern disposed on the base substrate and in the first opening, a thermal insulation layer disposed on the base substrate and covering the reflective layer and the shadow pattern, an absorption layer disposed on the thermal insulation layer, a bank layer disposed on the absorption layer, the bank layer including a second opening overlapping the first opening, a thermal conduction prevention pattern disposed on the absorption layer and overlapping the shadow pattern, and a transfer layer disposed on the absorption layer, the bank layer, and the thermal conduction prevention pattern.

20 Claims, 9 Drawing Sheets

OPTICAL PATTERNING MASK AND METHOD OF FABRICATING DISPLAY DEVICE USING THE SAME

CROSS-REFERENCE TO RELATED APPLICATION

This application claims priority from and the benefit of Korean Patent Application No. 10-2014-0100554, filed on Aug. 5, 2014, which is hereby incorporated by reference for all purposes as if fully set forth herein.

BACKGROUND

1. Field

Exemplary embodiments of the present invention relate to an optical patterning mask and a method of fabricating a display device using the same.

2. Discussion of the Background

An organic light-emitting display device (OLED) is a self light-emitting type display device that has garnered much attention as a next-generation display device because of its wide viewing angle, excellent contrast, and fast response rate characteristics.

The organic light-emitting display device may include an anode electrode, a cathode electrode, and an organic light-emitting layer (EML) provided between the anode electrode and the cathode electrode and formed of an organic light-emitting material. In response to a positive voltage and a negative voltage applied to the anode electrode and the cathode electrode, respectively, holes from the anode electrode may move to the EML through a hole injection layer (HIL) and a hole transport layer (HTL), and electrons from the cathode electrode may move to the EML through an electron injection layer (EIL) and an electron transport layer (ETL). The holes and the electrons may be recombined together in the EML. As the holes and the electrons recombine, excitons may be generated. When excitons transition from an excited state to a ground state, the EML may emit light, and as a result, an image may be displayed.

In the manufacture of the organic light-emitting display device, the HIL, the HTL, the EML, the ETL and the EIL may be formed by an inkjet printing method, a nozzle printing method, a deposition method using a metal mask, or a transfer method using heat or laser light.

The transfer method using heat or laser light, in particular, may allow fine patterning of the HIL, the HTL, the EML, the ETL, and the EIL. Accordingly, a high-resolution organic light-emitting display device may be produced.

According to the transfer method using heat or laser light, light emitted from a light source may be absorbed and converted into thermal energy by a light-to-heat conversion layer of a donor substrate, and a transfer layer may be transferred onto a predetermined device substrate by the thermal energy so as to form a pattern layer. For example, an EML material layer may be transferred onto a substrate of an organic light-emitting display device, and as a result, an EML may be formed.

However, the temperature of the thermal energy output from the light-to-heat conversion layer when absorbing light may not be uniform throughout the light-to-heat conversion layer. That is, the temperature of the thermal energy may increase only in a particular part of the light-to-heat conversion layer, for example, in a middle part of the light-to-heat conversion layer. Thus the thickness of the EML formed by transferring the EML material layer onto the substrate of the organic light-emitting display device may become irregular. As a result, the display quality of the organic light-emitting display device may deteriorate.

In addition, when the donor substrate is reused, the transfer material of the transfer layer may be accumulated on the donor substrate, and as a result, EMLs may be formed in different shapes and thicknesses. Accordingly, the reproducibility from repeated use of the donor substrate may deteriorate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide an optical patterning mask for forming a pattern layer with a uniform thickness and improving the reproducibility of the optical patterning mask from repeated use.

Exemplary embodiments of the present invention also provide a method of fabricating a display device using an optical patterning mask for forming a pattern layer with a uniform thickness and improving its reproducibility from repeated use.

Additional aspects will be set forth in the detailed description which follows, and, in part, will be apparent from the disclosure, or may be learned by practice of the inventive concept.

According to an exemplary embodiment of the invention, an optical patterning mask may include a base substrate, a reflective layer disposed on the base substrate, the reflective layer including a first opening, a shadow pattern disposed on the base substrate and in the first opening, a thermal insulation layer disposed on the base substrate and covering the reflective layer and the shadow pattern, an absorption layer disposed on the thermal insulation layer, a bank layer disposed on the absorption layer, the bank layer including a second opening overlapping the first opening, a thermal conduction prevention pattern disposed on the absorption layer and overlapping the shadow pattern, and a transfer layer disposed on the absorption layer, the bank layer, and the thermal conduction prevention pattern.

A surface of the thermal insulation layer contacting the absorption layer may be substantially flat.

The shadow pattern may be disposed in the first opening and may be isolated from the reflective layer or may partially contact the reflective layer, and a number of the shadow pattern may be more than two.

The thermal conduction prevention pattern may have the same shape as the shape of the shadow pattern, and a number of the thermal conduction prevention pattern may be the same as the number of the shadow pattern.

The thermal insulation layer may include a groove disposed on the surface of the thermal insulation layer contacting the absorption layer.

The groove may have an inverse-trapezoidal shape in a cross-sectional view.

The absorption layer may include an inclined absorption portion overlapping the groove and disposed in the second opening of the bank layer. The transfer layer may include a inclined transfer portion overlapping the inclined absorption portion.

The base substrate may include a light-transmissive substrate.

The reflective layer and the shadow pattern may include the same material.

The reflective layer and the shadow pattern may include at least one of aluminum (Al), silver (Ag), gold (Au), platinum (Pt), copper (Cu), an Al-based alloy, an Ag-based alloy, and indium oxide-tin oxide.

The thermal insulation layer may include at least one of titanium oxide, silicon oxide, silicon oxynitride, zirconium oxide, and silicon carbide.

The absorption layer may include a light-to-heat conversion layer converting light into thermal energy.

The absorption layer may include at least one of molybdenum (Mo), chromium (Cr), titanium (Ti), tin (Sn), tungsten (W), or an alloy thereof.

The bank layer and the thermal conduction prevention pattern may include the same material.

The bank layer and the thermal conduction prevention pattern may include an inorganic material or an organic material.

The transfer layer may include at least one of an organic light-emitting layer (EML) organic material, a hole injection layer (HIL) organic material, a hole transport layer (HTL) organic material, an electron injection layer (EIL) organic material, and an electron transport layer (ETL) organic material.

According to an exemplary embodiment of the present invention, a method of fabricating a display device using an optical patterning mask may include forming an optical patterning mask. The optical patterning mask may include a base substrate, a reflective layer disposed on the base substrate, the reflective layer including a first opening, a shadow pattern disposed on the base substrate and in the first opening, a thermal insulation layer disposed on the base substrate and covering the reflective layer and the shadow pattern, an absorption layer disposed on the thermal insulation layer, a bank layer disposed on the absorption layer, the bank layer including a second opening overlapping the first opening, a thermal conduction prevention pattern disposed on the absorption layer overlapping the shadow pattern, and a transfer layer disposed on the absorption layer, the bank layer, and the thermal conduction prevention pattern. The method further includes arranging a substrate of the display device over the optical patterning mask, the transfer layer facing a first electrode on the substrate of the display device, and forming an organic material layer on the first electrode by applying light from the base substrate to transfer a transfer material of the transfer layer on the absorption layer onto the first electrode.

The transfer layer may include at least one of an EML organic material, an HIL organic material, an HTL organic material, an EIL organic material, and an ETL organic material.

The shadow pattern may be disposed in the first opening and may be isolated from the reflective layer or may partially contact the reflective layer, and a number of the shadow pattern may be more than two.

The thermal conduction prevention pattern may have the same shape as the shape of the shadow pattern, and a number of the thermal conduction prevention pattern may be the same as the number of the shadow pattern.

According to the exemplary embodiments, a pattern layer (for example, an EML) having a uniform thickness may be formed on a predetermined substrate (for example, the substrate of a display device) through the transfer of the transfer material of a transfer layer, and thus a display device with an improved quality of display may be produced.

In addition, the thermal conduction prevention pattern may prevent the transfer material of the transfer layer from being additionally transferred and deposited onto the predetermined substrate. Accordingly, the thickness of a pattern layer formed on the predetermined substrate through the transfer of the transfer material of the transfer layer may be uniform.

Moreover, the amount of the transfer material of the transfer layer sublimated and deposited on each predetermined substrate may be evenly maintained after repeated use of the optical patterning mask. Accordingly, the reproducibility from repeated use of the optical patterning mask may be improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
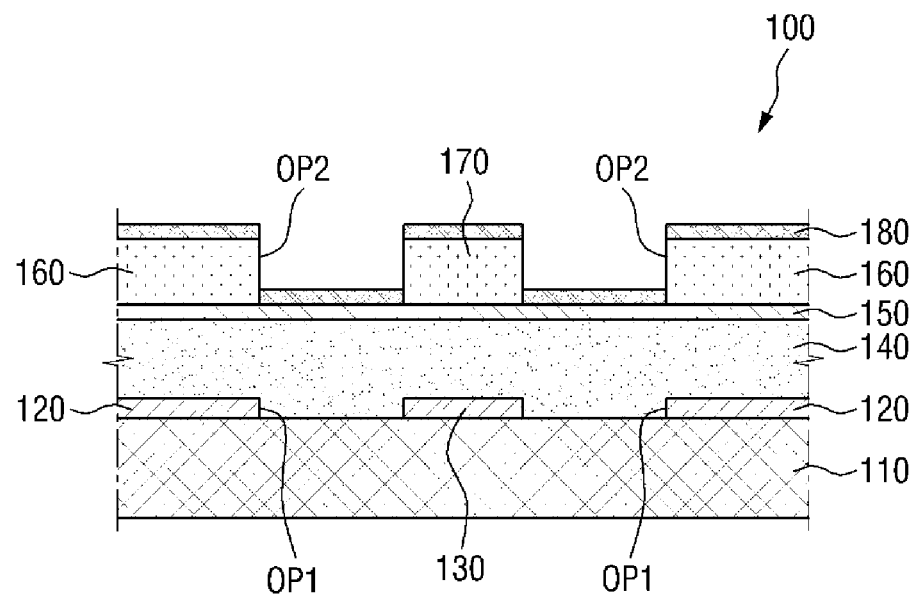
FIG. 1 is a cross-sectional view of an optical patterning mask according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature (s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
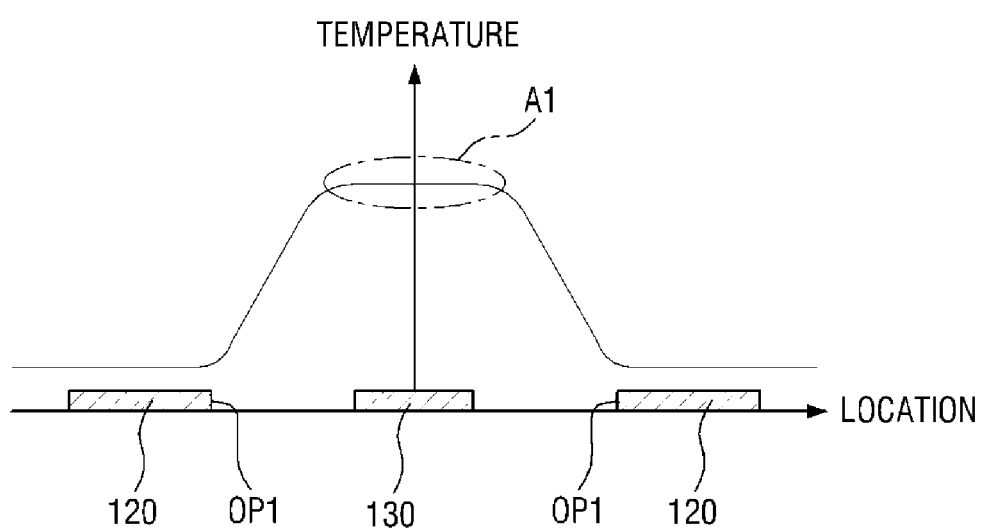
FIG. 2 is a graph showing the temperature profile of an absorption layer according to a shadow pattern of FIG. 1.
Figure 3:
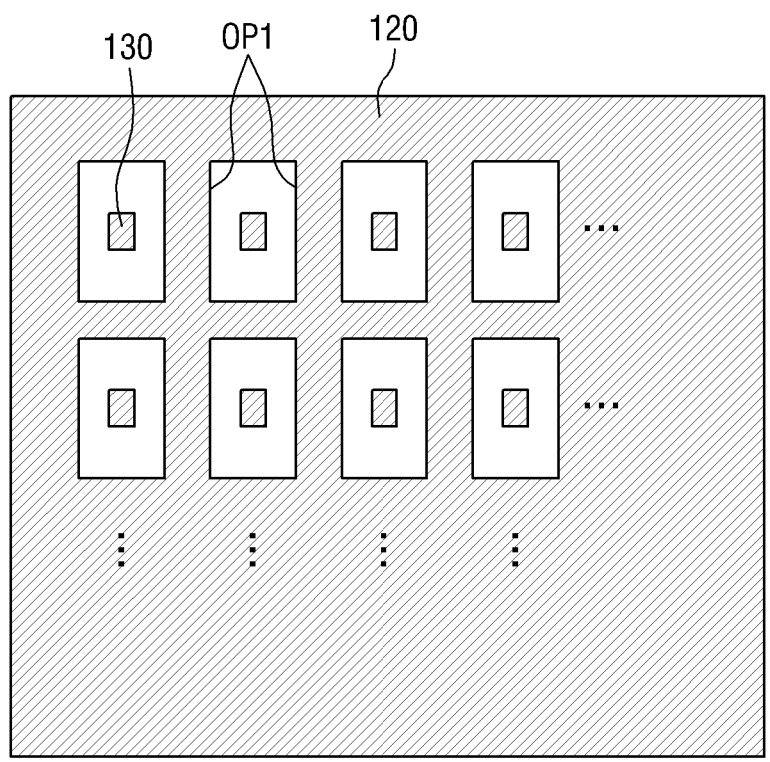
FIG. 3 is a plan view of a shadow pattern illustrated in FIG. 1.
Figure 4:
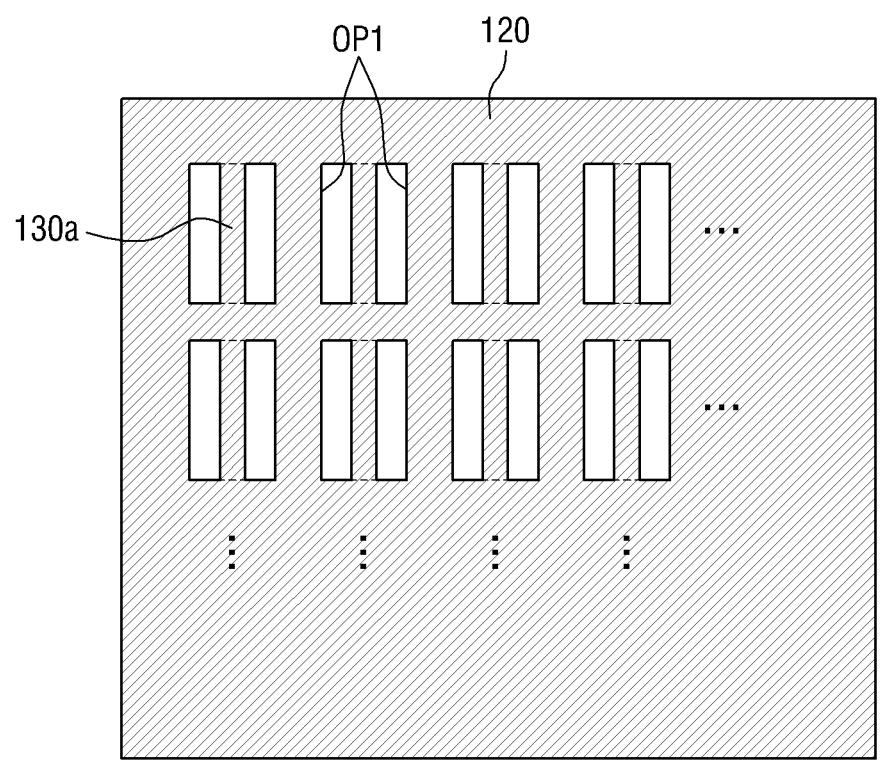
FIG. 4 is a plan view of a shadow pattern illustrated in FIG. 3.

FIG. 1 is a cross-sectional view of an optical patterning mask according to an exemplary embodiment of the present invention. FIG. 2 is a graph showing the temperature profile of an absorption layer according to a shadow pattern of FIG. 1. FIG. 3 is a plan view of a shadow pattern illustrated in FIG. 1. FIG. 4 is a plan view illustrating the shadow pattern according to an exemplary embodiment.

Referring to FIG. 1, an optical patterning mask 100 according to the present exemplary embodiment includes a base substrate 110, a reflective layer 120, a shadow pattern 130, a thermal insulation layer 140, an absorption layer 150, a bank layer 160, a thermal conduction prevention pattern 170, and a transfer layer 180.

The base substrate 110 may be a light-transmissive substrate that may transmit lamp light or laser light therethrough. For example, the base substrate 110 may be a glass substrate, a quartz substrate, or a synthetic resin substrate formed of a transparent polymer material with excellent light transmissivity, such as polyester, polyacryl, polyepoxy, polyethylene, polystyrene, and polyethylene terephthalate. The lamp light or laser light may pass through the base substrate 110, reach the absorption layer 150, and generate heat in the absorption layer 150.

The reflective layer 120 may be formed on the base substrate 110, and may include a first opening OP1. The reflective layer 120 may selectively provide the lamp light or laser light, penetrating the base substrate 110, to part of the absorption layer, 150 through the first opening OP1. Part of the absorption layer 150 may correspond to a pattern layer to be formed on a predetermined substrate through the transfer of a transfer material of the transfer layer 180 with the use of the optical patterning mask 100. The entire reflective layer 120, except for the first opening OP1, may reflect the lamp light or the laser light transmitted thereto through the base substrate 110 to travel back toward the base substrate 110.

The reflective layer 120 may include a material with a high reflectance with respect to lamp light or laser light, for example, a material selected from at least one of aluminum (Al), silver (Ag), gold (Au), platinum (Pt), copper (Cu), an Al-based alloy, an Ag-based alloy, and indium oxide/tin oxide. The reflective layer 120 may be formed by depositing the material with a high reflectance with respect to lamp light or laser light through sputtering, electron beam deposition, or vacuum deposition, and patterning the deposited material.

The shadow pattern 130 may be formed on the base substrate 110, and may be provided in the first opening OP1. The shadow pattern 130 may block the transmission of some of the lamp light or laser light transmitted thereto through the base substrate 110 to the absorption layer 150 through the first opening OP1. Accordingly, the temperature of thermal energy, which is generated in the absorption layer 150 by absorbing the light transmitted through the first opening OP1 of the reflective layer 120 and the thermal insulation layer 140, may be prevented from increasing only in a particular part of the absorption layer 150, for example, in a middle part of the absorption layer 150. Referring to FIG. 2, when the shadow pattern 130 is provided in the first opening OP1 of the reflective layer 120, the temperature of thermal energy in the absorption layer 150 may have a Gaussian profile with a flat top A1 in the middle, rather than a Gaussian profile with a convex top in the middle.

The shadow pattern 130 may prevent the temperature of the thermal energy in the absorption layer 150 from increasing only in a particular part of the absorption layer 150 and may make the temperature of the thermal energy in the absorption layer 150 generally uniform throughout the absorption layer 150. Accordingly, the transfer material of the transfer layer 180, which is heated by the thermal energy from the absorption layer 150 corresponding to the first opening OP1, may be uniformly sublimated. As a result, when a sublimated transfer material is transferred onto a predetermined substrate, a pattern layer may be formed with uniform thickness.

In contrast, when the temperature of the thermal energy in the absorption layer 150 has a Gaussian profile with a convex top in the middle, the temperature of the absorption layer 150 may be higher in a middle part of the absorption layer 150 corresponding to the first opening OP1 than on the edges of the absorption layer 150. Thus, the rate at which the transfer material of the transfer layer 180 is sublimated may be higher in the middle part of the absorption layer 150 corresponding to the first opening OP1 than on the edges of the absorption layer 150. As a result, a pattern layer formed on a predetermined substrate may be thicker in the middle than at the edges. That is, the pattern layer may be formed with non-uniform thickness.

A shadow pattern 130 may be provided in the first opening OP1 of the reflective layer 120, and may include a material with high reflectance with respect to lamp light or laser light, for example, a material selected from at least one of Al, Ag, Au, Pt, Cu, an Al-based alloy, an Ag-based alloy, and indium oxide-tin oxide. The shadow pattern 130 may be formed of the same material as the reflective layer 120 during the formation of the reflective layer 120. As illustrated in FIG. 3, according to the present exemplary embodiment, a plurality of shadow patterns 130 may be provided in a plurality of first openings OP1, respectively, as islands and may be isolated from the reflective layer 120. Alternatively, as illustrated in FIG. 4, according to an exemplary embodiment, a plurality of shadow patterns 130a may be formed in the first openings OP1, respectively, to partially contact the reflective layer 120.

The thermal insulation layer 140 may be formed on the base substrate 110 to cover the reflective layer 120 and the shadow pattern 130. The surface of the thermal insulation layer 140 contacting the absorption layer 150 may be flat. When a light reflected by the reflective layer 120 is converted to heat and the heat remains in the reflective layer 120, the thermal insulation layer 140 may prevent the heat from being transmitted to the absorption layer 150 and the transfer layer 180. The thermal insulation layer 140 may be formed of a material with low thermal conductivity. More specifically, the thermal insulation layer 140 may be formed of a light-transmissive material with low thermal conductivity to transmit light transmitted thereto through the first opening OP1 of the reflective layer 120 to the absorption layer 150. For example, the thermal insulation layer 140 may be formed from at least one of titanium oxide, silicon oxide, silicon oxynitride, zirconium oxide, silicon carbide, silicon nitride, and an organic polymer. The thermal insulation layer 140 may be formed through deposition by sputtering, electron beam deposition, or vacuum deposition.

The absorption layer 150 may be formed on the thermal insulation layer 140. The absorption layer 150 may be a light-to-heat conversion layer absorbing light transmitted thereto through the base substrate 110, the first opening OP1 of the reflective layer 120, and the thermal insulation layer 140, and converting the light into thermal energy. Due to the thermal energy generated by the absorption layer 150, the transfer material of the transfer layer 180 on the absorption layer 150 may be sublimated, and may be transferred onto a predetermined substrate, thereby forming a pattern layer. Part of the transfer layer 180 corresponding to the shadow pattern 130 may not be sublimated by the thermal energy generated by the absorption layer 150.

The absorption layer 150 may be formed of a material with low optical reflectance and high optical absorptivity. For example, the absorption layer 150 may be formed of molybdenum (Mo), chromium (Cr), titanium (Ti), tin (Sn), tungsten (W), or an alloy thereof. The absorption layer 150 may be formed through deposition by sputtering, electron beam deposition, or vacuum deposition.

The bank layer 160 may be formed on the absorption layer 150, and may include a second opening OP2, which overlaps the first opening OP1. That is, the bank layer 160 may be formed in the same shape as the reflective layer 120. The bank layer 160 may allow part of the transfer layer 180 on part of the absorption layer 150 overlapping the second opening OP2 to be transferred and deposited onto a designated part of a predetermined substrate through sublimation caused by the thermal energy from the absorption layer 150. Part of the transfer layer 180 on the bank layer 160 may not be sublimated. The bank layer 160 may be formed of an inorganic material such as silicon oxide or silicon nitride. Alternatively, the bank layer 160 may be formed of an organic material.

The thermal conduction prevention pattern 170 may be formed on the absorption layer 150, and may overlap the shadow pattern 130. That is, the thermal conduction prevention pattern 170 may be provided in the second opening OP2 of the bank layer 160. The thermal conduction prevention pattern 170 may isolate part of the transfer layer 180 formed on the absorption layer 150, which overlaps to the shadow pattern 130, from the absorption layer 150, so that the corresponding part of the transfer layer 180 may not directly contact the absorption layer 150.

Accordingly, thermal energy may be prevented from being transmitted from part of the absorption layer 150 not corresponding to the shadow pattern 130 to part of the absorption layer 150 corresponding to the shadow pattern 130 during the transfer of the transfer layer 180 onto a predetermined substrate by using the optical patterning mask 100. Therefore, the transfer material of the part of the transfer layer 180 that remains yet to be sublimated on the part of the absorption layer 150 corresponding to the shadow pattern 130 may be prevented from being additionally sublimated and transferred onto the predetermined substrate even after the formation of a pattern layer on the predetermined substrate. Accordingly, the thickness of the pattern layer may be uniform.

In addition, since the transfer material of the part of the transfer layer 180 that remains yet to be sublimated on the part of the absorption layer 150 corresponding to the shadow pattern 130 may be prevented from being additionally sublimated, the shape of the part of the transfer layer 180 that remains yet to be sublimated on the part of the absorption layer 150 corresponding to the shadow pattern 130 may not change after repeated use of the optical patterning mask 100. Accordingly, the amount of the transfer material of the transfer layer 180 transferred and deposited onto each substrate may be uniformly maintained after repeated use of the optical patterning mask 100. Thus, pattern layers with a desired size and a uniform width may be formed continuously. Therefore, the reproducibility from repeated use of the optical patterning mask 100 may be improved.

The thermal conduction prevention pattern 170 may have the same shape and the same quantity as that of the shadow pattern 130. The thermal conduction prevention pattern 170 may be formed of an inorganic material such as silicon oxide or silicon nitride. The bank layer 160 may be formed of an organic material. The thermal conduction prevention pattern 170 may be formed of the same material as the bank layer 160 during the formation of the bank layer 160.

The transfer layer 180 may be formed on the absorption layer 150, the bank layer 160, and the thermal conduction prevention pattern 170. The transfer layer 180 may be transferred to a predetermined substrate through sublimation caused by the thermal energy from the absorption layer 150. However, parts of the transfer layer 180 on the bank layer 160 and the thermal conduction prevention pattern 170 may not be transferred.

The transfer layer 180 may be formed of a predetermined transfer material including the material of a pattern layer to be formed on a predetermined substrate. For example, the transfer layer 180 may include one or more organic materials for forming an organic material layer of an organic light-emitting display device, such as one selected from an organic light-emitting layer (EML) organic material, a hole injection layer (HIL) organic material, a hole transport layer (HTL) organic material, an electron injection layer (EIL) organic material, and an electron transport layer (ETL) organic material.

The transfer layer 180 may be formed by a wet method such as spin coating, spray coating, inkjet printing, nozzle printing, dip coating, die coating, roll coating, blade coating, bar coating, or gravure coating. Alternatively, the transfer layer 180 may be formed by vacuum deposition or sputtering.

As illustrated above, since the optical patterning mask 100 may include the shadow pattern 130, the temperature of thermal energy in the absorption layer 150, particularly, in part of the absorption layer 150 corresponding to the first opening OP1, may be uniform, and as a result, the transfer material of the transfer layer 180 may be uniformly sublimated.

Therefore, by using the optical patterning mask 100, a pattern layer (for example, an EML) may be formed with uniform thickness on a predetermined substrate (for example, a substrate for forming a display device) through the transfer of the transfer layer 180. As a result, a display device may have an improved display quality.

In addition, since the optical patterning mask 100 may include the thermal conduction prevention pattern 170, part of the transfer layer 180 that remains yet to be sublimated on part of the absorption layer 150 corresponding to the shadow pattern 130 may be isolated from the absorption layer 150.

Accordingly, the part of the transfer layer 180 that remains yet to be sublimated on the part of the absorption layer 150 corresponding to the shadow pattern 130 may be prevented from being additionally sublimated during the transfer of the transfer layer 180.

Therefore, the optical patterning mask 100 may prevent a pattern layer from being formed with non-uniform thickness on a predetermined substrate. Also, since the amount of the transfer layer 180 transferred and deposited on each substrate through sublimation may be uniformly maintained after repeated use of the optical patterning mask 100, the reproducibility from repeated use of the optical patterning mask 100 may be improved.

Figure 5:
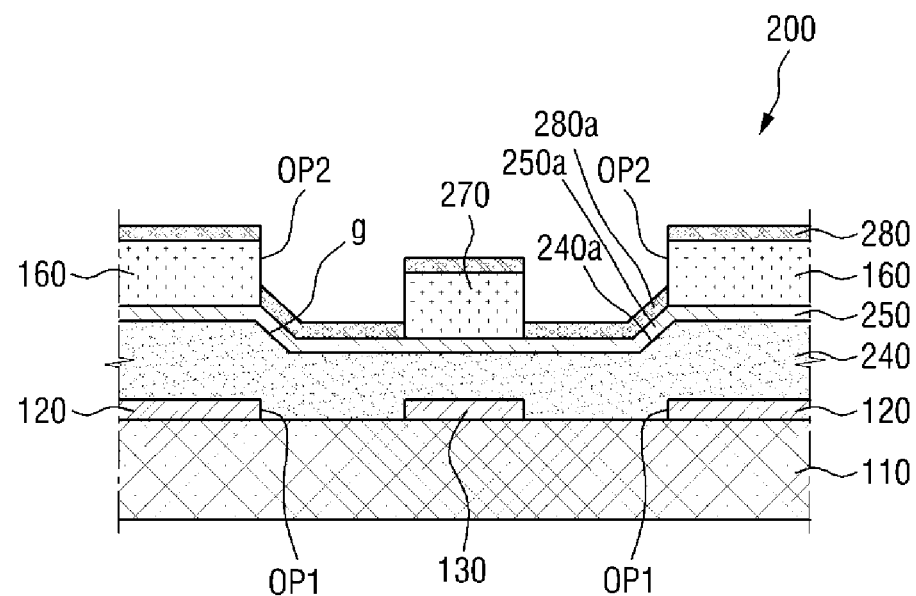
FIG. 5 is a cross-sectional view of an optical patterning mask according to an exemplary embodiment of the present invention.

FIG. 5 is a cross-sectional view of an optical patterning mask according to an exemplary embodiment of the present invention.

Referring to FIG. 5, an optical patterning mask 200 according to the present exemplary embodiment has similar structure as the optical patterning mask 100 of FIG. 1. A thermal insulation layer 240, an absorption layer 250, and a thermal conduction prevention pattern 270 will be described further below.

The thermal insulation layer 240 is similar to the thermal insulation layer 140 illustrated in FIG. 1, but may further include a groove g, which is formed on a surface of the thermal insulation layer 240 contacting the absorption layer 250 and corresponds to a first opening OP1 of a reflective layer 120. The groove g may have an inverse-trapezoidal shape in a cross-sectional view. Due to the presence of the groove g, inclined surfaces 240a may be provided on the surface of the thermal insulation layer 240 contacting the absorption layer 250.

The absorption layer 250 is similar to the absorption layer 150 illustrated in FIG. 1, but may further include inclined absorption portions 250a, which are formed along the inclined surfaces 240a, respectively, of the thermal insulation layer 240. The inclined absorption portions 250a may be positioned at the corners of part of the absorption layer 250 in a second opening OP2 of a bank layer 160, and are inclined.

The thermal conduction prevention pattern 270 is similar to the thermal conduction prevention pattern 170 illustrated in FIG. 1, but the top surface of the thermal conduction prevention pattern 270 may be lower than the top surface of the bank layer 160 due to the groove g of the thermal insulation layer 240.

A transfer layer 280 is similar to the transfer layer 180 illustrated in FIG. 1, but may further include inclined transfer portions 280a, which are formed along the inclined absorption portions 250a, respectively, of the absorption layer 250. The inclined transfer portions 280a may be positioned at the corners of part of the transfer layer 280 in the second opening OP2 of the bank layer 160, overlapping the inclined absorption portions 250a, respectively, and are inclined.

A transfer material of the inclined transfer portions 280a may be heated and sublimated by thermal energy from the inclined absorption portions 250a, and the sublimated transfer material may be transferred inwardly, rather than outwardly, from the top of the second opening OP2 of the bank layer 160. Accordingly, a pattern layer may be prevented from being formed to an undesirable shape, for example, with tails on the edges thereof, due to the transfer material from the edges of the transfer layer 280 being transferred and deposited on the outside of the boundaries of a designated area for the pattern layer.

As described above, the optical patterning mask 200 may include the thermal insulation layer 240 having the inclined surface 240a, the absorption layer 250 having the inclined absorption portions 250a, and the transfer layer 280 having the inclined transfer portions 280a. Accordingly, the optical patterning mask 200 may prevent part of the transfer layer 280 corresponding to the second opening OP2 of the bank layer 160 from being transferred and deposited on the outside of the boundaries of a designated area for a pattern layer to be formed during the transfer of the transfer layer 280 through sublimation onto a predetermined substrate.

Therefore, the optical patterning mask 200 may prevent a pattern layer from being formed to an undesirable shape, for example, with tails on the edges.

Figure 6:
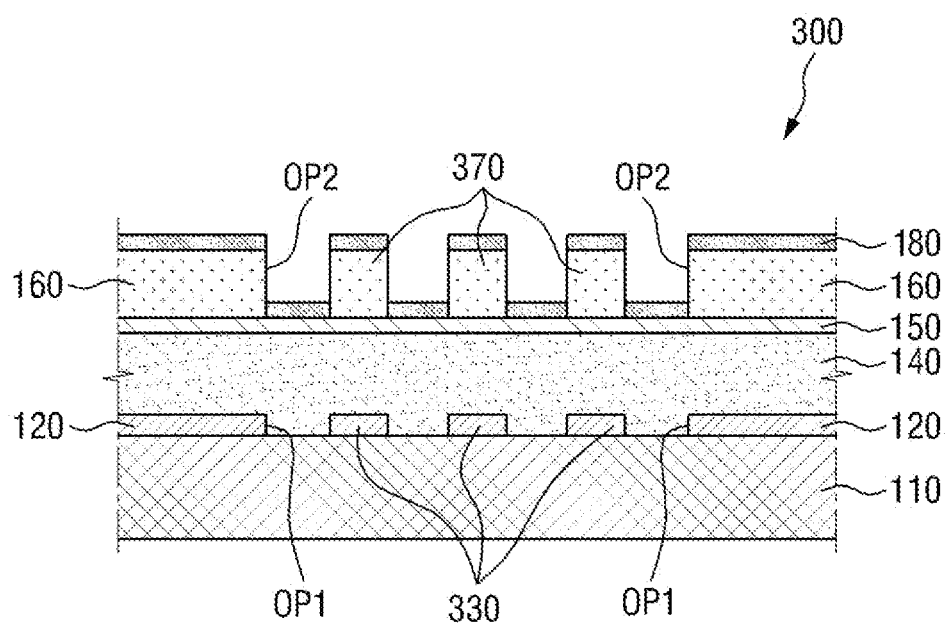
FIG. 6 is a cross-sectional view of an optical patterning mask according to an exemplary embodiment of the present invention.

FIG. 6 is a cross-sectional view of an optical patterning mask according to an exemplary embodiment of the present invention.

Referring to FIG. 6, an optical patterning mask 300 according to the present exemplary embodiment has similar structure as the optical patterning mask 100 of FIG. 1, but may further include a plurality of shadow patterns 330, and a plurality of thermal conduction prevention patterns 370, which will be described further hereinafter.

Figure 7:
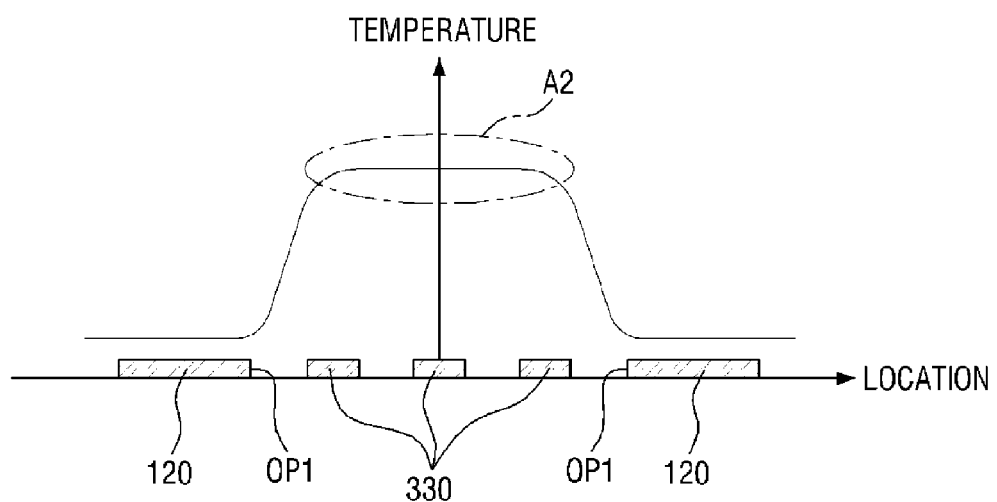
FIG. 7 is a graph showing the temperature profile of an absorption layer according to a shadow pattern of FIG. 6.

The shadow patterns 330 are similar to the shadow pattern 130 illustrated in FIG. 1, but may have more than one shadow pattern 330, for example, three shadow patterns 330, may be formed in a first opening OP1 of a reflective layer 120. When more than one shadow pattern 330 is provided in the first opening OP1, the temperature of thermal energy generated in an absorption layer 150 by absorbing the light transmitted through the first opening OP1 of the reflective layer 120 and a thermal insulation layer 140, may have a Gaussian profile with a widened flat top A2, rather than a convex top, in the middle, as illustrated in FIG. 7.

The shadow patterns 330 may prevent the temperature of thermal energy in the absorption layer 150 from increasing only in a particular portion of the absorption layer 150, and may make the temperature of the thermal energy generally uniform throughout the absorption layer 150. Accordingly, the transfer material of the transfer layer 180, which is heated by the thermal energy in part of the absorption layer 150 corresponding to the first opening OP1, may be uniformly sublimated. As a result, when the sublimated transfer material is transferred onto a predetermined substrate, a pattern layer may be formed with uniform thickness.

The thermal conduction prevention patterns 370 are similar to the thermal conduction prevention pattern 170 illustrated in FIG. 1, but more than one thermal conduction prevention pattern 370 may be formed in a second opening OP2 in a similar manner to the shadow patterns 330. That is, the number of thermal conduction prevention patterns 370 may be equal to the number of shadow patterns 330.

As described above, since the optical patterning mask 300 may include the shadow patterns 330, the temperature of thermal energy in the absorption layer 150 may be uniform throughout the shadow patterns 330, and the transfer material of the transfer layer 180 may be uniformly sublimated.

Therefore, a display device may have an improved quality of display by using the optical patterning mask 300 which transfers the transfer material of the transfer layer 180 to a predetermined substrate to form a pattern layer, such as a light emitting layer, having a uniform thickness.

In addition, since the optical patterning mask 300 includes the thermal conduction prevention patterns 370, parts of the transfer layer 180 that remain yet to be sublimated on parts of the absorption layer 150 corresponding to the shadow patterns 330 may be isolated from the absorption layer 150.

Accordingly, the parts of the transfer layer 180 that remain yet to be sublimated on the parts of the absorption layer 150 corresponding to the shadow patterns 330 may be prevented from being additionally sublimated during the transfer of the transfer layer 180.

Therefore, the optical patterning mask 300 may prevent the pattern layer from being formed to have a non-uniform thickness on a predetermined substrate. Also, since the amount of the transfer layer 180 transferred and deposited on each substrate through sublimation may be uniformly maintained after repeated use of the optical patterning mask 300, the reproducibility from repeated use of the optical patterning mask 300 may be improved.

A method of fabricating a display device using an optical mask, according to an exemplary embodiment of the present invention will hereinafter be described.

FIGS. 8 to 11 are cross-sectional views illustrating a method of fabricating a display device using an optical patterning mask, according to the present exemplary embodiment.

Figure 8:
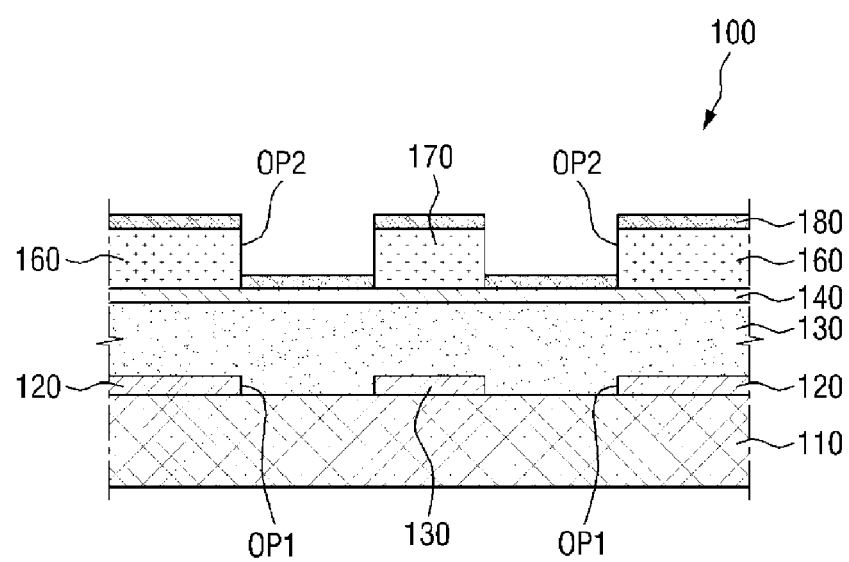
FIGS. 8 to 11 are cross-sectional views illustrating a method of fabricating a display device using an optical patterning mask, according to an exemplary embodiment of the present invention.

Referring to FIG. 8, an optical patterning mask 100 is prepared. The optical patterning mask 100 may include a base substrate 110, a reflective layer 120 formed on the base substrate 110 and including a first opening OP1, a shadow pattern 130 formed on the base substrate 110 and provided in the first opening OP1, a thermal insulation layer 140 formed on the base substrate 110 to cover the reflective layer 120 and the shadow pattern 130, an absorption layer 150 formed on the thermal insulation layer 140, a bank layer 160 including a second opening OP2 overlapping the first opening OP1, a thermal conduction prevention pattern 170 formed on the absorption layer 150 to overlap the shadow pattern 130, and a transfer layer 180 formed on the absorption layer 150, the bank layer 160, and the thermal conduction prevention pattern 170. All constituent elements in the optical patterning mask 100 according to the present exemplary embodiment are substantially similar to those in the optical patterning mask according to the exemplary embodiment described with respect to FIG. 1, and repeated description thereof is omitted.

Figure 9:
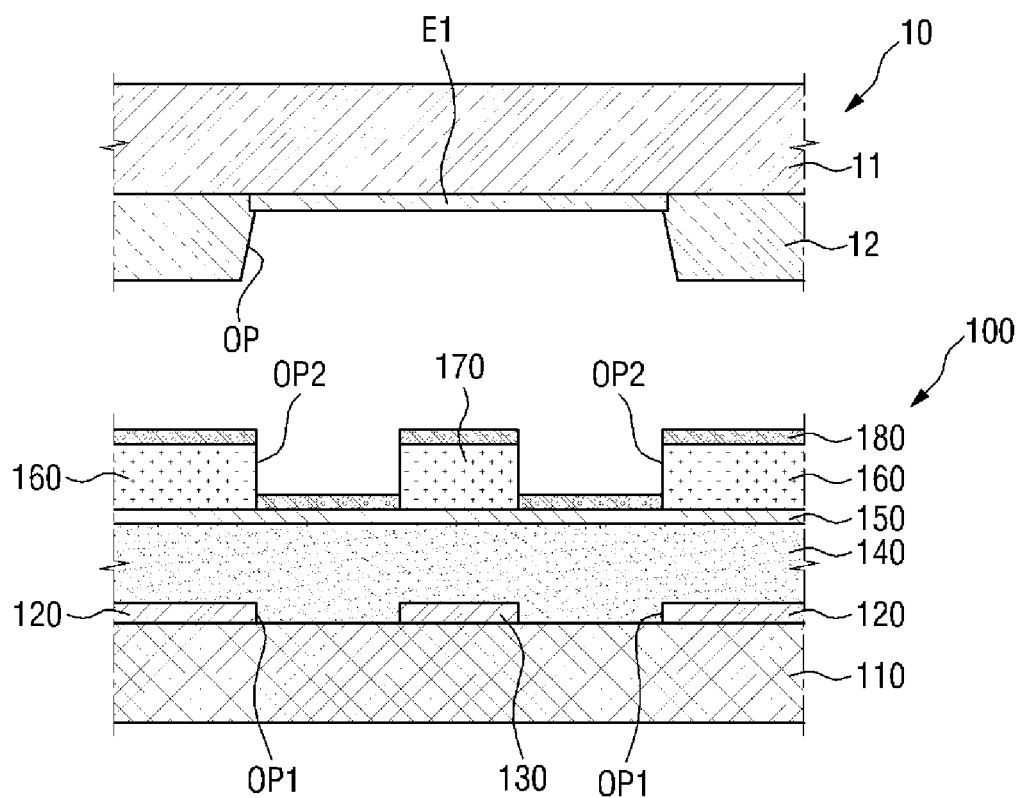

Referring to FIG. 9, a substrate 11 of an organic light-emitting display device 10 may be arranged over the optical patterning mask 100 such that the transfer layer 180 of the optical patterning mask 100 faces, for example, a first electrode E1 of the substrate 11 of the organic light-emitting display device 10. The transfer layer 180 of the optical patterning mask 100 may include, for example, an organic material. The first electrode E1 may be exposed through an opening OP of a pixel-defining layer 12, which defines each pixel on the substrate 11.

Figure 10:
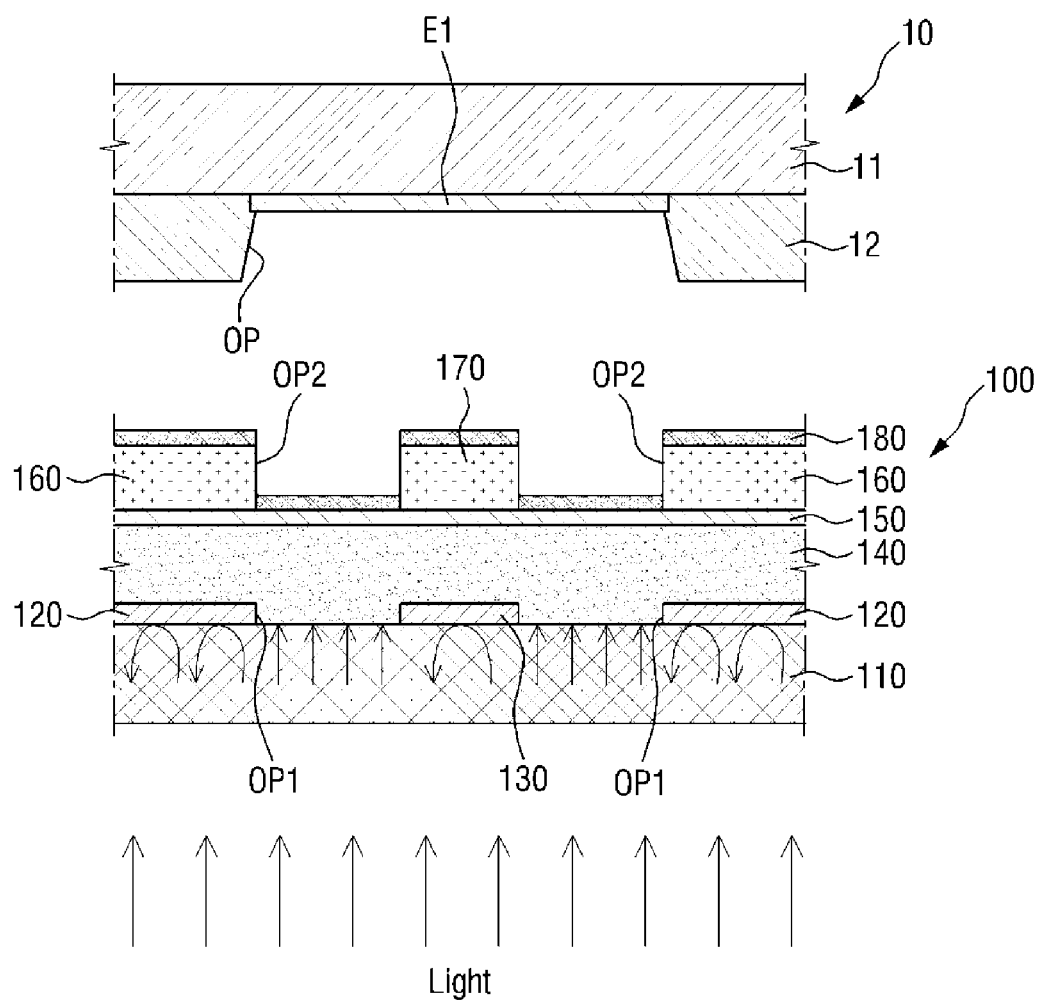

Referring to FIG. 10, an organic material layer, for example, an EML, may be formed by applying light from below the base substrate 110 to transfer the transfer material of the transfer layer 180 on the absorption layer 150 onto the first electrode E1 of the first substrate 11 of the organic light-emitting display device 10. The transfer layer 180 may include an EML organic material.

More specifically, light may be applied from below the base substrate 110. The light may pass through the base substrate 110, and may be transmitted to, and absorbed by, the absorption layer 150 through the first opening OP1 and the thermal insulation layer 140. The entire reflection layer 120 except for the first opening OP1 may reflect light transmitted thereto through the base substrate 110 to travel back toward the base substrate 110. Light absorbed by the absorption layer 150 may be converted into thermal energy, and the thermal energy sublimates the EML organic material of the transfer layer 180. The EML organic material is transferred and deposited onto the first electrode E1 of the first substrate 11 of the organic light-emitting display device 10. As a result, an EML may be formed on the first electrode E1 of the first substrate 11 of the organic light-emitting display device 10, as illustrated in FIG. 11.

Figure 11:
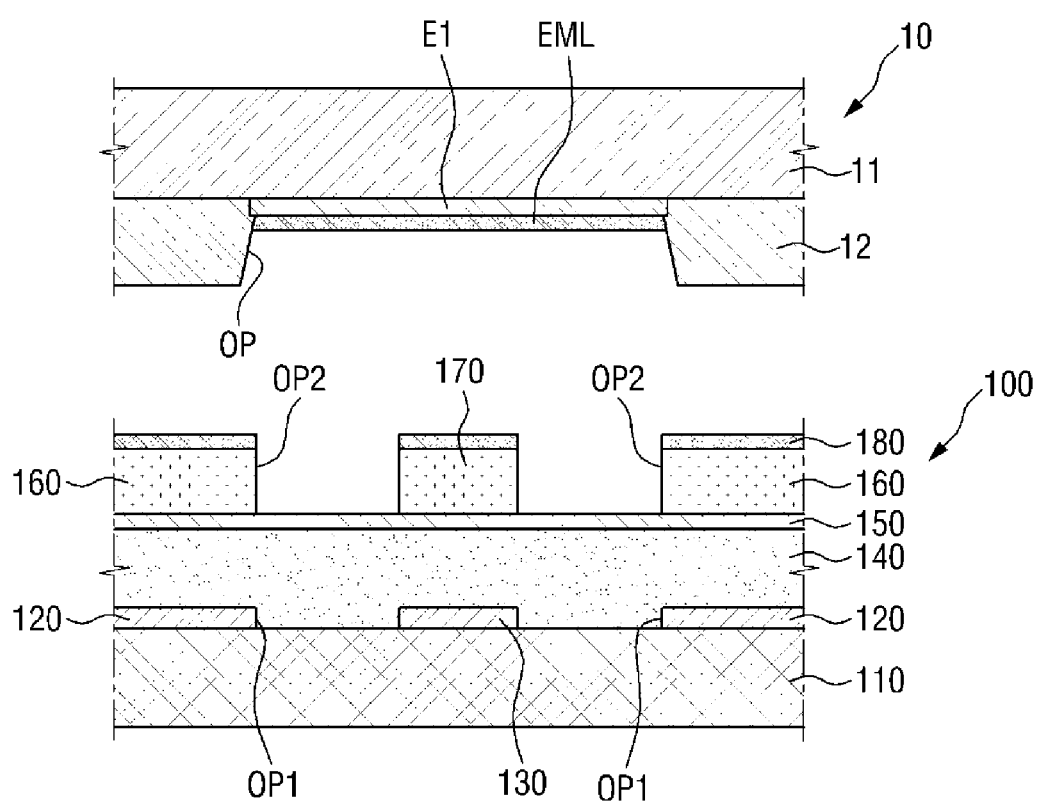
Figure 12:
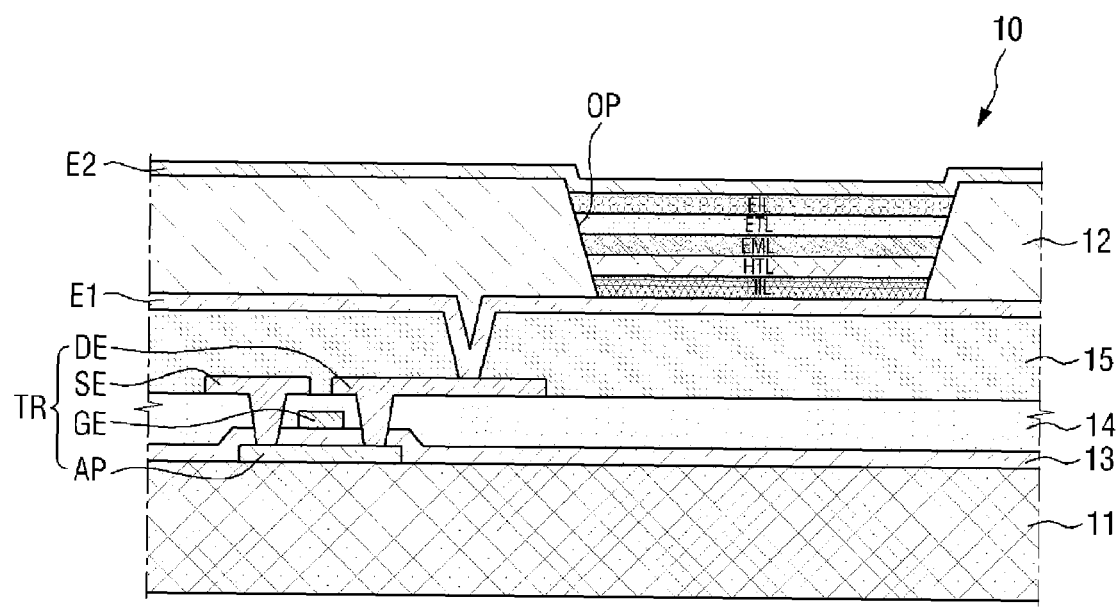
FIG. 12 is a cross-sectional view of an organic light-emitting display device obtained by the method of FIGS. 8 to 11.

The formation of an EML on the first electrode E1 of the first substrate 11 of the organic light-emitting display device 10 by using the optical patterning mask 100 is illustrated in FIG. 11. In the present exemplary embodiment, at least one of an HIL, an HTL, an ETL, and an EIL may be formed by using the optical patterning mask 100 as illustrated in FIG. 12. In the present exemplary embodiment, the transfer layer 180 may include at least one of an HIL organic material, an HTL organic material, an EIL organic material, and an ETL organic material.

A display device obtained by using the optical patterning mask 100, for example, an organic light-emitting display device, will hereinafter be described.

FIG. 12 is a cross-sectional view of an organic light-emitting display device obtained by the method illustrated in FIGS. 8 to 11.

Referring to FIG. 12, an organic light-emitting display device 10 includes a substrate 11, a semiconductor layer AP, a gate electrode GE, a source electrode SE, a drain electrode DE, a gate insulating layer 13, an interlayer dielectric layer 14, a planarization layer 15, a pixel-defining layer 12, a first electrode E1, an HIL, an HTL, an EML, an ETL, an EIL, and a second electrode E2.

The substrate 11 may be formed of a transparent insulating material. For example, the substrate 11 may be formed of glass, quartz, a ceramic material, or a plastic material. The substrate 11 may be a flat panel. In an exemplary embodiment, the substrate 11 may be formed of a material that is easily bendable by external force. The substrate 11 may support other elements arranged thereon.

The semiconductor layer AP may be disposed on the substrate 11. The semiconductor layer AP may be formed as an amorphous silicon layer or a polycrystalline silicon layer. The semiconductor layer AP may include a channel region not doped with impurities, a source region, and a drain region provided on both sides of the channel region, doped with p+ impurities, and contacting the source electrode S and the drain electrode D, respectively. The semiconductor layer AP may be doped with p-type impurities including boron (B), for example, $B_2H_6$. The type of impurities doping the semiconductor layer AP may vary.

The gate insulating layer 13 may be disposed on the semiconductor layer AP. The gate insulating layer 13 may insulate the gate electrode GE and the semiconductor layer AP from each other. The gate insulating layer 13 may be formed of silicon nitride or silicon oxide.

The gate electrode GE may be disposed on the gate insulating layer 13. The gate electrode GE may overlap with at least portion of the semiconductor layer AP. The semiconductor layer AP may become conductive or nonconductive depending on a voltage applied to the gate electrode GE. For example, in response to a relatively high voltage applied to the gate electrode GE, the semiconductor layer AP may become conductive, and may thus electrically connect the drain electrode DE and the source electrode SE together. On the other hand, in response to a relatively low voltage applied to the gate electrode GE, the semiconductor layer AP may become nonconductive, and may thus insulate the drain electrode DE and the source electrode SE from each other.

The interlayer dielectric layer 14 may be disposed on the gate electrode GE. The interlayer dielectric layer 14 may cover the gate electrode GE, and may thus insulate the gate electrode GE from the source electrode SE and the drain electrode DE. The interlayer dielectric layer 14 may be formed of silicon nitride or silicon oxide.

The source electrode SE and the drain electrode DE may be disposed on the interlayer dielectric layer 14. The source electrode SE and the drain electrode DE may be connected to the semiconductor layer AP through holes, which may be formed through the interlayer dielectric layer 14 and the gate insulating layer 13.

The source electrode SE, the drain electrode DE, the gate electrode GE, and the semiconductor layer AP may form a thin-film transistor (TFT) TR. The TFT TR may decide whether to transmit a signal applied to the source electrode SE to the drain electrode DE based on a voltage applied to the gate electrode GE.

The planarization layer 15 may be formed on the interlayer dielectric layer 14, the source electrode SE, and the drain electrode DE. The planarization layer 15 may eliminate the height differences between the source electrode SE and the drain electrode DE. The planarization layer 15 may have a flat surface over the source electrode SE and the drain electrode DE to improve the light emission efficiency of the EML, which is provided on the planarization layer 15.

The planarization layer 15 may be formed of at least one of a polyacrylate resin, an epoxy resin, a phenolic resin, a polyamide resin, a polyimide resin, an unsaturated polyester resin, a polyphenylenether resin, a polyphenylenesulfide resin, and benzocyclobuten (BCB).

A via hole may be formed on the planarization layer 15. The first electrode E1 may contact, and may be electrically connected to, the drain electrode DE through the via hole.

The first electrode E1 may be disposed on the planarization layer 15 and below the EML. The first electrode E1 may be electrically connected to the drain electrode DE through the via hole, and may transmit a signal applied to the drain electrode DE to the bottom of the EML.

The first electrode E1 may be formed of a reflective conductive material, a transparent conductive material, or a semi-transparent conductive material. For example, one of lithium (Li), calcium (Ca), lithium fluoride/calcium (LiF/Ca), lithium fluoride/aluminum (LiF/Al), Al, Ag, magnesium (Mg), or Au may be used as the transparent conductive material. For transparent conductive material, indium tin oxide (ITO), indium zinc oxide (IZO), zinc oxide (ZnO), or indium oxide ($In_2O_3$) may be used. For semi-transparent conductive material, a co-deposition material containing at least one of Mg and Ag, or at least one of Mg, Ag, Ca, Li and Al may be used.

The pixel-defining layer 12 may be disposed on the planarization layer 15. The pixel-defining layer 12 may define pixels included in the organic light-emitting display device 10 into separate pixels, and may include the opening OP. The first electrode E1 may be exposed through the opening OP. The HIL, the HTL, the EML, the ETL, and the EIL may be disposed on the first electrode E1 in the opening OP.

The HIL may be formed on part of the first electrode E1 exposed through the opening OP of the pixel-defining layer 12, and may cover the entire pixel-defining layer 12. The HIL may be a buffer layer lowering the energy barrier between the first electrode E1 and the HTL, and may facilitate the injection of holes from the first electrode E1 into the HTL. The HIL may be formed of an organic compound, for example, 4,4', 4"-tris(3-methylphenylphenylamino)triphenylamine (MT-DATA) or poly(3,4-ethylenedioxythiphene, polystyrene sulfonate (PEDOT/PSS).

The HTL may be formed on the HIL. The HTL may transmit holes provided by the HIL to the EML. The HTL may be formed of an organic compound, for example, N,N'-diphenyl-N,N'-bis(3-methylphenyl)-1,1'-bi-phenyl-4,4'-diamine (TPD) or N,N'-di(naphthalen-1-yl)-N,N'-diphenyl-benzidine (NPB).

The EML may be formed on the HTL. The EML may emit light by recombining holes provided by the first electrode E1 and electrons provided by the second electrode E2. More specifically, in response to holes and electrons being provided to the EML, the holes and the electrons may be combined together, and as a result, excitons may be generated in the EML. In response to the transition of the excitons from an excited state to a ground state, light may be emitted from the EML. The EML may include a red light-emitting layer emitting red light, a green light-emitting layer emitting green light, and a blue light-emitting layer emitting blue light.

The ETL may be formed on the EML, and may transmit electrons provided by the second electron E2 to the EML. The ETL may be formed of an organic compound, for example, 4,7-diphenyl-1,10-phenanthroline (Bphen), BAlq, Tris(8-quinolinorate)aluminum (Alq3), berylliumbis(benzoquinolin-10-olate (Bebq$_2$), or TPBI.

The EIL may be formed on the ETL. The EIL may be a buffer layer lowering the energy barrier between the ETL and the second electrode E2, and may facilitate the injection of electrons from the second electrode E2 into the ETL. The EIL may be formed of, for example, LiF or CsF.

The second electrode E2 may be disposed on the EIL. The second electrode E2 may be formed of the same material as the first electrode E1. In an exemplary embodiment, the second electrode E2 may be a common electrode provided for the plurality of pixels included in the organic light-emitting display device 10. In an exemplary embodiment, the second electrode E2 may be disposed on the EIL and on the entire top surface of the pixel-defining layer 12. The emission of light from the EML may be controlled by a current that flows between the first electrode E1 and the second electrode E2.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An optical patterning mask, comprising:
   a base substrate;
   a reflective layer disposed on the base substrate, the reflective layer comprising a first opening;
   a shadow pattern disposed on the base substrate and in the first opening;
   a thermal insulation layer disposed on the base substrate and covering the reflective layer and the shadow pattern;
   an absorption layer disposed on the thermal insulation layer;
   a bank layer disposed on the absorption layer, the bank layer comprising a second opening overlapping the first opening;
   a thermal conduction prevention pattern disposed on the absorption layer and overlapping the shadow pattern; and
   a transfer layer disposed on the absorption layer, the bank layer, and the thermal conduction prevention pattern.

2. The optical patterning mask of claim 1, wherein a surface of the thermal insulation layer contacting the absorption layer is substantially flat.

3. The optical patterning mask of claim 1, wherein the shadow pattern is disposed in the first opening and isolated from the reflective layer or partially contacting the reflective layer, and wherein a number of the shadow pattern is more than two.

4. The optical patterning mask of claim 3, wherein the thermal conduction prevention pattern has the same shape as the shape of the shadow pattern, and wherein a number of the thermal conduction prevention pattern is the same as the number of the shadow pattern.

5. The optical patterning mask of claim 1, wherein the thermal insulation layer comprises a groove disposed on a surface of the thermal insulation layer contacting the absorption layer.

6. The optical patterning mask of claim 5, wherein the groove comprises an inverse-trapezoidal shape in a cross-sectional view.

7. The optical patterning mask of claim 6, wherein:
   the absorption layer comprises an inclined absorption portion overlapping the groove, and disposed in the second opening of the bank layer; and
   the transfer layer comprises an inclined transfer portion overlapping the inclined absorption portion.

8. The optical patterning mask of claim 1, wherein the base substrate comprises a light-transmissive substrate.

9. The optical patterning mask of claim 1, wherein the reflective layer and the shadow pattern comprise the same material.

10. The optical patterning mask of claim 1, wherein the reflective layer and the shadow pattern comprise at least one of aluminum (Al), silver (Ag), gold (Au), platinum (Pt), copper (Cu), an Al-based alloy, an Ag-based alloy, and indium oxide-tin oxide.

11. The optical patterning mask of claim 1, wherein the thermal insulation layer comprises at least one of titanium oxide, silicon oxide, silicon oxynitride, zirconium oxide, and silicon carbide.

12. The optical patterning mask of claim 1, wherein the absorption layer comprises a light-to-heat conversion layer converting light into thermal energy.

13. The optical patterning mask of claim 1, wherein the absorption layer comprises at least one of molybdenum (Mo), chromium (Cr), titanium (Ti), tin (Sn), tungsten (W), or an alloy thereof.

14. The optical patterning mask of claim 1, wherein the bank layer and the thermal conduction prevention pattern comprise the same material.

15. The optical patterning mask of claim 1, wherein the bank layer and the thermal conduction prevention pattern comprise an inorganic material or an organic material.

16. The optical patterning mask of claim 1, wherein the transfer layer comprises at least one of an organic light-emitting layer (EML) organic material, a hole injection layer (HIL) organic material, a hole transport layer (HTL) organic material, an electron injection layer (EIL) organic material, and an electron transport layer (ETL) organic material.

17. A method of fabricating a display device using an optical patterning mask, the method comprising:
   forming the optical patterning mask comprising:
      a base substrate;
      a reflective layer disposed on the base substrate, the reflective layer comprising a first opening;
      a shadow pattern disposed on the base substrate and in the first opening;
      a thermal insulation layer disposed on the base substrate and covering the reflective layer and the shadow pattern;
      an absorption layer disposed on the thermal insulation layer;
      a bank layer disposed on the absorption layer, the bank layer comprising a second opening overlapping the first opening;
      a thermal conduction prevention pattern disposed on the absorption layer overlapping the shadow pattern; and
      a transfer layer disposed on the absorption layer, the bank layer, and the thermal conduction prevention pattern;
   arranging a substrate of the display device over the optical patterning mask, the transfer layer facing a first electrode on the substrate of the display device; and
   forming an organic material layer on the first electrode by applying light from the base substrate to transfer a transfer material of the transfer layer on the absorption layer onto the first electrode.

18. The method of claim 17, wherein the transfer layer comprises at least one of an EML organic material, an HIL organic material, an HTL organic material, an EIL organic material, and an ETL organic material.

19. The method of claim 17, wherein the shadow pattern is disposed in the first opening and isolated from the reflective layer or partially contacting the reflective layer, and wherein a number of the shadow pattern is more than two.

20. The method of claim 19, wherein the thermal conduction prevention pattern has the same shape as the shape of the shadow pattern, and wherein a number of the thermal conduction prevention pattern is the same as the number of the shadow pattern.

* * * * *